United States Patent … US 10,262,921 B2
Lohtander et al. … Date of Patent: Apr. 16, 2019

(54) SEMICONDUCTOR MODULE

(71) Applicant: LAPPEENRANNAN TEKNILLINEN YLIOPISTO, Lappeenranta (FI)

(72) Inventors: Mika Lohtander, Lappeenranta (FI); Leevi Paajanen, Lappeenranta (FI); Tapani Siivo, Lappeenranta (FI); Antti Jortikka, Lappeenranta (FI); Hannu Ylisiurua, Lappeenranta (FI); Emma Paasonen, Lappeenranta (FI); Jyrki Montonen, Lappeenranta (FI)

(73) Assignee: LAPPEENRANNAN TEKNILLINEN YLIOPISTO, Lappeenranta (FI)

(*) Notice: Subject to any disclaimer, the term of this patent is extended or adjusted under 35 U.S.C. 154(b) by 2 days.

(21) Appl. No.: 15/543,922

(22) PCT Filed: Dec. 30, 2015

(86) PCT No.: PCT/FI2015/050958
§ 371 (c)(1),
(2) Date: Jul. 14, 2017

(87) PCT Pub. No.: WO2016/113461
PCT Pub. Date: Jul. 21, 2016

(65) Prior Publication Data
US 2018/0012822 A1 Jan. 11, 2018

(30) Foreign Application Priority Data
Jan. 15, 2015 (FI) ........................... 20155031

(51) Int. Cl.
H01L 23/473 (2006.01)
H01L 23/04 (2006.01)
(Continued)

(52) U.S. Cl.
CPC ........ *H01L 23/473* (2013.01); *H01L 21/4871* (2013.01); *H01L 23/04* (2013.01);
(Continued)

(58) Field of Classification Search
CPC .............................. H01L 23/46; H01L 23/473
(Continued)

(56) References Cited

U.S. PATENT DOCUMENTS 5,268,814 A 12/1993 Yakubowski
5,317,478 A 5/1994 Sobhani
(Continued)

FOREIGN PATENT DOCUMENTS

EP 1 796 165 A2 6/2007
JP H09-307040 A 11/1997
(Continued)

OTHER PUBLICATIONS

International Search Report, dated Mar. 24, 2016, from corresponding PCT application No. PCT/FI2015/050958.
(Continued)

*Primary Examiner* — David Vu
*Assistant Examiner* — Brandon C Fox
(74) *Attorney, Agent, or Firm* — Young & Thompson

(57) ABSTRACT

A semiconductor module includes a baseplate, a cover element attached to the baseplate so that detaching the cover element from the baseplate requires material deformations, and a semiconductor element in a room defined by the baseplate and the cover element. The semiconductor element is in a heat conductive relation with the baseplate and an outer surface of the baseplate is provided with laser machined grooves suitable for conducting heat transfer fluid. The laser machining makes it possible to make the grooves after the semiconductor module has been assembled. Therefore, regular commercially available semiconductor mod-
(Continued)

ules can be modified, with the laser machining, to semiconductor modules as disclosed.

13 Claims, 3 Drawing Sheets

(51) Int. Cl.
 *H01L 23/10* (2006.01)
 *H01L 21/48* (2006.01)
 *H01L 23/053* (2006.01)
(52) U.S. Cl.
 CPC ............ *H01L 23/053* (2013.01); *H01L 23/10* (2013.01); *H01L 2924/0002* (2013.01)
(58) Field of Classification Search
 USPC .................................................. 361/688, 699
 See application file for complete search history.

(56) References Cited

U.S. PATENT DOCUMENTS

| | | | | |
|---|---|---|---|---|
| 6,388,317 | B1* | 5/2002 | Reese | H01L 23/473 257/713 |
| 6,992,888 | B1* | 1/2006 | Iyer | H01L 23/3732 165/80.4 |
| 7,050,308 | B2* | 5/2006 | Kenny, Jr. | G06F 1/26 361/764 |
| 7,140,753 | B2* | 11/2006 | Wang | F21K 9/00 362/294 |
| 7,353,859 | B2* | 4/2008 | Stevanovic | H01L 23/473 165/170 |
| 8,792,239 | B2* | 7/2014 | Son | H01L 23/4334 165/80.4 |
| 9,480,149 | B2* | 10/2016 | Mokhtarzad | H05K 1/0272 |
| 2002/0080563 | A1 | 6/2002 | Pence et al. | |
| 2006/0002088 | A1 | 1/2006 | Bezama et al. | |
| 2010/0127390 | A1* | 5/2010 | Barth | H01L 23/473 257/714 |
| 2014/0119394 | A1* | 5/2014 | Schleuning | H01S 5/02407 372/35 |
| 2017/0179001 | A1* | 6/2017 | Brunschwiler | H01L 23/473 |

FOREIGN PATENT DOCUMENTS

| | | |
|---|---|---|
| WO | 95/08844 A1 | 3/1995 |
| WO | 02/055908 A1 | 7/2002 |

OTHER PUBLICATIONS

FI Search Report, dated Sep. 10, 2015, from corresponding FI application No. 20155031.

* cited by examiner

SEMICONDUCTOR MODULE

TECHNICAL FIELD

The disclosure relates generally to thermal management of electrical devices, e.g. power electronic devices. More particularly, the disclosure relates to a semiconductor module suitable for being, for example but not necessarily, a basic construction unit of an electrical converter. Furthermore, the disclosure relates to a method for fabricating a semiconductor module.

BACKGROUND

Semiconductor modules which comprise a baseplate, a cover element, and one or more semiconductor elements can be used as main circuit components of various electrical devices such as for example frequency converters, rectifiers, and network inverters. The above-mentioned semiconductor element can be for example a bipolar junction transistor "BJT", a diode, an insulated gate bipolar transistor "IGBT", a thyristor, a gate-turn-off thyristor "GTO", a metal-oxide-semiconductor field-effect transistor "MOSFET", or any other kind of semiconductor element. When a semiconductor element of the kind mentioned above conducts electrical current, heat is produced by internal resistance of the semiconductor element. If the heating rate exceeds the available heat dissipation, there is a risk of temperature rise affecting changes in electrical behavior, such that thermal damage could occur in the semiconductor element under consideration. Therefore, it is important to provide sufficient thermal management, in this case cooling, for the semiconductor element.

A thermal management arrangement for a semiconductor module of the kind mentioned above comprises typically a heat-sink element against which the semiconductor module is attached so that the baseplate of the semiconductor module is against a flat surface of the heat sink element. The heat-sink element may comprise cooling fins for conducting heat to the ambient air and/or ducts for conducting heat transfer fluid, e.g. water. A thermal management arrangement of the kind described above is, however, not free from challenges. One of the challenges relates to the joint between the baseplate of the semiconductor module and the heat-sink element. In order to provide a sufficient and reliable thermal management, the thermal resistance of the above-mentioned joint should be as low as possible. Furthermore, the heat conductivity per unit area $W/Km^2$ can be unevenly distributed over the joint area between the baseplate and the heat-sink element. The distribution of the heat conductivity may have a stochastic nature, and a worst case situation takes place when a local minimum of the heat conductivity happens to be in a hot spot of the baseplate. The heat conduction from the baseplate to the heat-sink element can be, at least in some extend, improved by using gap filler material, e.g. silicone paste, between the baseplate and the heat-sink element but the ageing of the gap filler materials may be problematic.

SUMMARY

The following presents a simplified summary in order to provide a basic understanding of some aspects of various invention embodiments. The summary is not an extensive overview of the invention. It is neither intended to identify key or critical elements of the invention nor to delineate the scope of the invention. The following summary merely presents some concepts of the invention in a simplified form as a prelude to a more detailed description of exemplifying embodiments of the invention.

In accordance with the invention, there is provided a new semiconductor module that can be used as a component of various electrical devices such as, for example but not necessarily, frequency converters, rectifiers, and network inverters. A semiconductor module according to the invention comprises:
- a baseplate,
- a cover element attached to the baseplate so that detaching the cover element from the base plate requires material deformations, and
- at least one semiconductor element in a room limited by the baseplate and the cover element, the semiconductor element being in a heat conductive relation with the baseplate.

The outer surface of the baseplate facing away from the semiconductor element is provided with laser machined grooves suitable for conducting heat transfer fluid, for example water, wherein the grooves comprise a transition region between first ones of the grooves and second ones of grooves, the transition region being shaped so that flow-resistance from the first ones of the grooves to the second ones of the grooves is smaller than flow-resistance in an opposite direction from the second ones of the grooves to the first ones of the grooves. The surfaces of the grooves constitute a part of walls of channels conducting the heat transfer fluid and thus the heat transfer fluid is in direct contact with the baseplate. Therefore, the thermal contact between the baseplate and an element which is against the baseplate, actually against the ridges between the grooves, and which constitutes another part of the walls of the above-mentioned channels does not play such a role as in a case where the heat transfer fluid is not in direct contact with the baseplate. Furthermore, since the baseplate comprises the grooves, the heat conductive surface of the baseplate which is in contact with the heat transfer fluid is greater than in a case where the surface of the baseplate is flat. Yet furthermore, the grooves can be designed so that the heat transfer fluid is effectively directed to hot spots of the baseplate, i.e. to the spots of the baseplate which are closest to the heat generating one or more semiconductor elements. It is worth noting that in most cases the thermal management of the above-described semiconductor module can be either single phase thermal management or two-phase thermal management where the heat transfer fluid is vaporized in the grooves.

In accordance with the invention, there is provided also a new method for fabricating a semiconductor module. A method according to the invention comprises:
- obtaining a semiconductor module that comprises a baseplate, a cover element attached to the baseplate so that detaching the cover element from the baseplate requires material deformations, and a semiconductor element in a room defined by the baseplate and the cover element, the semiconductor element being in a heat conductive relation with the baseplate, and subsequently
- laser machining, on an outer surface of the baseplate facing away from the semiconductor element, grooves suitable for conducting heat transfer fluid.

The laser machining makes it possible to make the grooves after the semiconductor module has been assembled. Therefore, the laser machining makes it possible to modify regular commercially available semiconductor modules to semiconductor modules according to the invention.

A number of exemplifying and non-limiting embodiments of the invention are described in accompanied dependent claims.

Various exemplifying and non-limiting embodiments of the invention both as to constructions and to methods of operation, together with additional objects and advantages thereof, will be best understood from the following description of specific exemplifying and non-limiting embodiments when read in connection with the accompanying drawings.

The verbs "to comprise" and "to include" are used in this document as open limitations that neither exclude nor require the existence of unrecited features. The features recited in dependent claims are mutually freely combinable unless otherwise explicitly stated. Furthermore, it is to be understood that the use of "a" or "an", i.e. a singular form, throughout this document does not exclude a plurality.

BRIEF DESCRIPTION OF THE FIGURES

Exemplifying and non-limiting embodiments of the invention and their advantages are explained in greater detail below in the sense of examples and with reference to the accompanying drawings, in which.

DESCRIPTION OF THE EXEMPLIFYING EMBODIMENTS

Figure 1A:
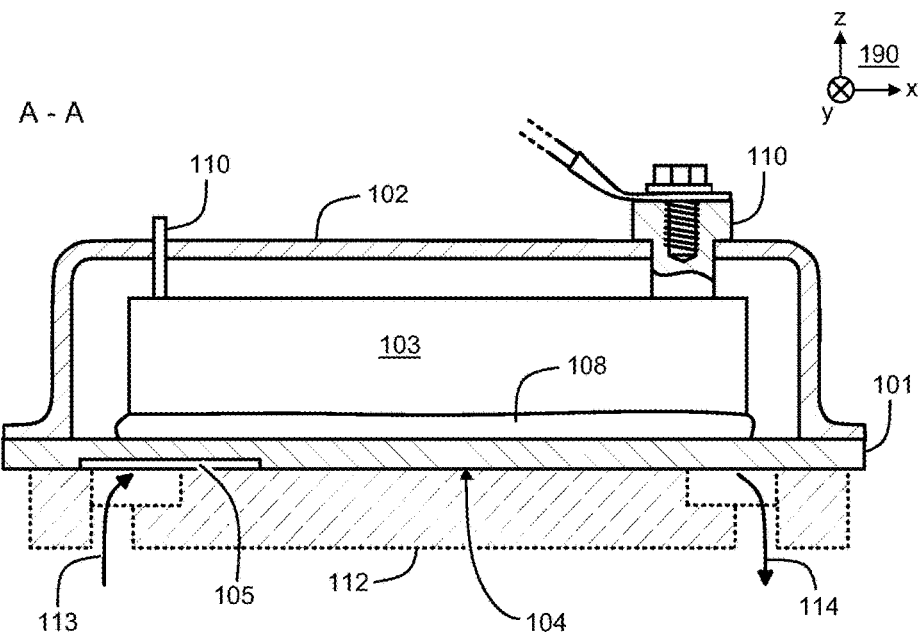
FIGS. 1a, 1b, and 1c illustrate a semiconductor module according to an exemplifying and non-limiting embodiment of the invention.
Figure 1B:
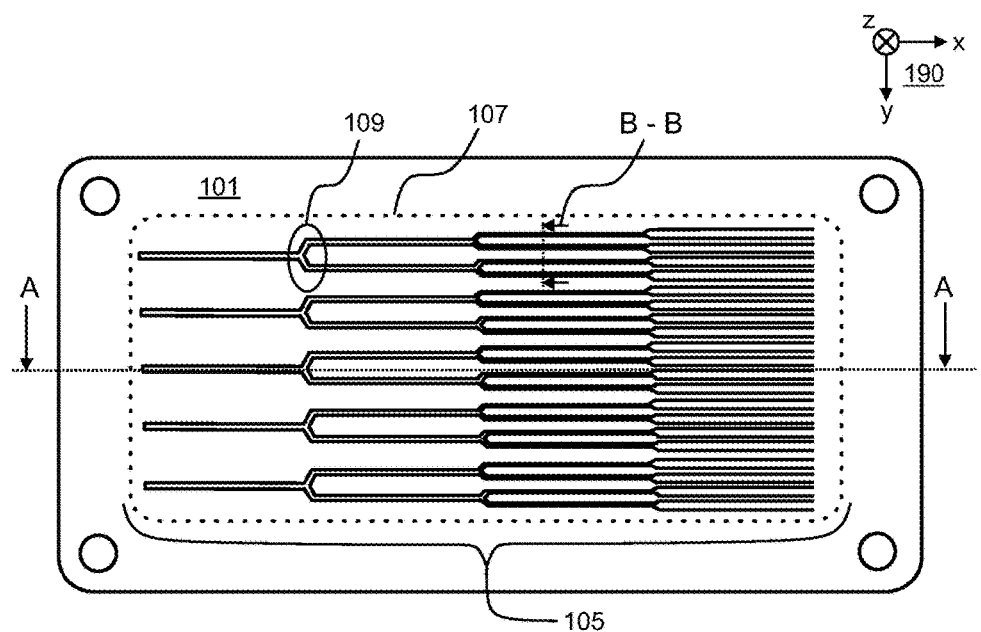
Figure 1C:
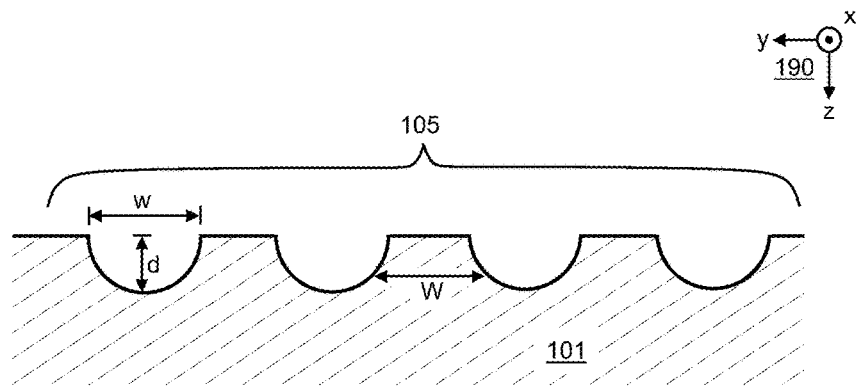

FIG. 1a shows a section view of a semiconductor module according to an exemplifying and non-limiting embodiment of the invention. FIG. 1b shows a bottom view of the semiconductor module. The section shown in FIG. 1a is taken along a line A-A shown in FIG. 1b. The section plane is parallel with the xz-plane of a coordinate system 190. FIG. 1c shows a section taken along a line B-B shown in FIG. 1b. The section plane related to FIG. 1c is parallel with the yz-plane of the coordinate system 190. The semiconductor module comprises a baseplate 101 that is advantageously made of metal comprising e.g. copper and/or aluminum in order to achieve good thermal conductivity through the baseplate. The semiconductor module comprises a cover element 102 permanently attached to the baseplate so that detaching the cover element from the base plate requires material deformations. The semiconductor module comprises at least one semiconductor element 103 in a room limited by the baseplate 101 and the cover element 102. The at least one semiconductor element 103 is in a heat conductive relation with the baseplate 101. The semiconductor module can be a discrete semiconductor component so that the semiconductor module comprises only one semiconductor element, or the semiconductor element can be an integrated system that comprises two or more semiconductor elements. The semiconductor module may comprise for example three or six semiconductor elements including antiparallel diodes so that the semiconductor module may constitute for example a main circuit of an upper or lower portion of a three-phase inverter bridge or a main circuit of a whole three-phase inverter bridge. Each semiconductor element can be a controllable semiconductor element such as for example a bipolar junction transistor "BJT", an insulated gate bipolar transistor "IGBT", a thyristor, a gate-turn-off thyristor "GTO", or a metal-oxide-semiconductor field-effect transistor "MOSFET". Furthermore, each semiconductor element can be a combination of a controllable semiconductor element and an antiparallel diode. It is also possible that the semiconductor element is a mere diode. The baseplate 101 and the cover element 102 constitute advantageously airtight encapsulation for the at least one semiconductor element, i.e. the room containing the at least one semiconductor element is advantageously hermetic. Furthermore, the semiconductor module comprises electrical main terminals for conducting the main electrical current or currents of the semiconductor module. The semiconductor module may further comprise one or more control terminals for controlling a controllable semiconductor element, e.g. in IGBT. In FIG. 1a, one of the main terminals is denoted with a reference number 110 and a control terminal is denoted with a reference number 111.

The outer surface 104 of the baseplate facing away from the semiconductor element 103 is provided with laser machined grooves 105 suitable for conducting heat transfer fluid e.g. water. The geometrical pattern of the grooves 105 is illustrated in FIG. 1b. In this exemplifying case, an area 107 provided with the grooves on the outer surface of the baseplate 101 has substantially a rectangular shape and the grooves are substantially parallel with the longer sides of the rectangular area.

In the exemplifying semiconductor module illustrated in FIGS. 1a-1c, the grooves have a rounded bottom profile as illustrated in FIG. 1c. The rounded bottom profile is advantageous in the sense that the ridges between mutually adjacent grooves are tapering in the negative z-direction of the coordinate system 190. Therefore, the widths W of the ridges are at their greatest at the bottom sections of the ridges where the heat flow in each ridge in the negative z-direction towards the top of the ridge is at its greatest. The heat flow in the negative z-direction gets smaller when approaching the top of the ridge because heat is conducted through the walls of the grooves, i.e. through the walls of the ridges, to the heat transfer fluid flowing in the grooves. Thus, the profile of the ridges shown in FIG. 1c is advantageous from the viewpoint of the heat transfer from the baseplate 101 to the heat transfer fluid. The grooves are advantageously micro-grooves whose widths w are on the range from 25 μm to 2000 μm, and whose depths d are on the range from 25 μm to 2000 μm. From the viewpoints of the manufacturing the grooves and the flow speed of the heat transfer fluid, the widths w of the grooves are more advantageously on the range from 100 μm to 800 μm, and the depths d of the grooves are more advantageously on the range from 100 μm to 800 μm. The widths and the depths, w and d, of the grooves are illustrated in FIG. 1c.

In the exemplifying semiconductor module illustrated in FIGS. 1a-1c, the grooves 105 are branching so that a sum of gross-sectional areas of the grooves increases in each branching. One of the branching areas is denoted with a reference number 109 in FIG. 1b. The grooves which are branching in the above-mentioned way are advantageous especially in conjunction with two-phase thermal management where the heat transfer fluid flows in the grooves in the positive x-direction of the coordinate system 190 and the heat transfer fluid is vaporized in the grooves and thus the volume of the heat transfer fluid increases in the grooves. FIG. 1a shows a dashed-line section view of a guide element 112 which forces the heat transfer fluid to flow in the grooves. The arrival of the heat transfer fluid is denoted with an arrow 113 and the departure of the heat transfer fluid is denoted with an arrow 114.

The exemplifying semiconductor module illustrated in FIGS. 1a-1c comprises a thermally conductive and electrically insulating structure 108 having mechanical contacts with the semiconductor element 103 and with an inner surface of the baseplate 101 facing towards the semiconductor element. The thermally conductive and electrically insulating structure 108 can be for example silicon or other suitable flexible material which provides a sufficient thermal conductivity from the semiconductor element 103 to the baseplate 101.

Figure 2:
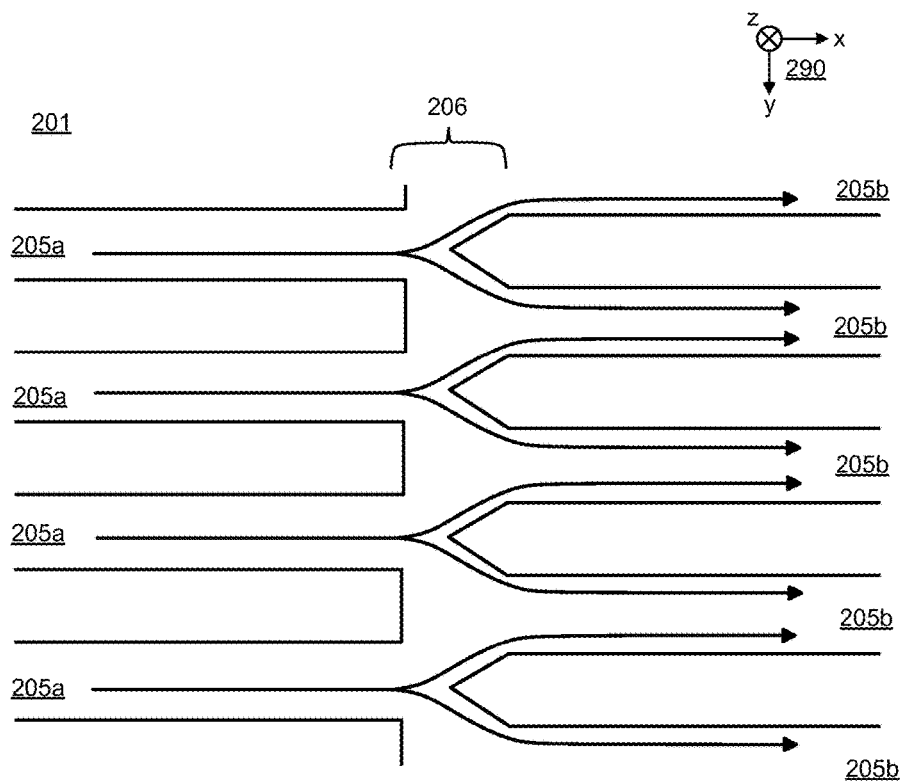
FIG. 2 illustrates a detail of a semiconductor module according to an exemplifying and non-limiting embodiment of the invention.

FIG. 2 illustrates a detail of a semiconductor module according to an exemplifying and non-limiting embodiment of the invention. FIG. 2 shows a part of the grooves on the surface of the baseplate of the semiconductor module. In this exemplifying case, the grooves comprise a transition region 206 between first ones 205a of the grooves and second ones 205b of grooves so that flow-resistance from the first ones of the grooves to the second ones of the grooves is smaller than flow-resistance in an opposite direction from the second ones of the grooves to the first ones of the grooves. The flow of the heat transfer fluid is depicted with arrows in FIG. 2. As can been seen from FIG. 2, the transition region 206 is shaped so that the flow-resistance in the positive x-direction of a coordinate system 290 is smaller than the flow-resistance in the negative x-direction. This property is advantageous especially in conjunction with two-phase thermal management because this property acts against a tendency of the heat transfer fluid to flow backward in the grooves due to the volume expansion caused by vaporization.

Figure 3:
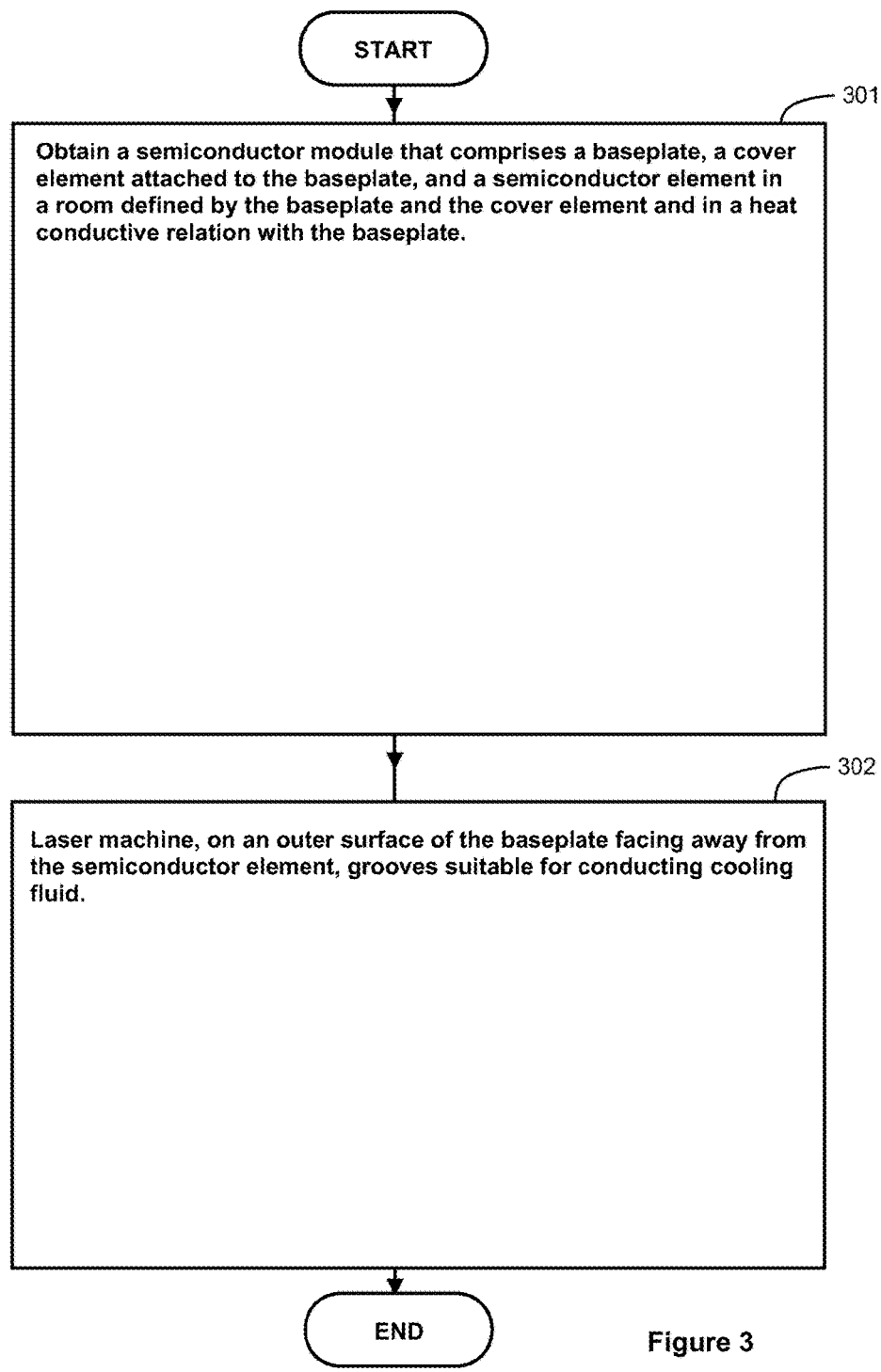
FIG. 3 shows a flowchart of a method according to an exemplifying and nonlimiting embodiment of the invention for fabricating a semiconductor module.

FIG. 3 shows a flowchart of a method according to an exemplifying and nonlimiting embodiment of the invention for fabricating a semiconductor module. The method comprises the following method phases:

method phase 301: obtaining a semiconductor module that comprises a baseplate, a cover element attached to the baseplate so that detaching the cover element from the baseplate requires material deformations, and a semiconductor element in a room defined by the baseplate and the cover element, the semiconductor element being in a heat conductive relation with the baseplate, and subsequently method phase 302: laser machining, on an outer surface of the baseplate facing away from the semiconductor element, grooves suitable for conducting heat transfer fluid.

The grooves are advantageously micro-grooves whose widths are on the range from 25 µm to 2000 µm and whose depths are on the range from 25 µm to 2000 µm. More advantageously, the widths are on the range from 100 µm to 800 µm and the depths are on the range from 100 µm to 800 µm.

Guidelines for designing the grooves comprise advantageously pre-corrections so that non-idealities of the laser machining have been taken into account in the guidelines. The pre-corrections are based on the fact that the non-idealities of the laser machining are known á priori.

The semiconductor module obtained in the method phase 301 can be a commercially available semiconductor module.

The specific examples provided in the description given above should not be construed as limiting the applicability and/or interpretation of the appended claims.

What is claimed is:

1. A semiconductor module comprising:
    a baseplate,
    a cover element attached to the baseplate so that detaching the cover element from the base plate requires material deformations, and
    at least one semiconductor element in a room limited by the baseplate and the cover element, the semiconductor element being in a heat conductive relation with the baseplate, wherein an outer surface of the baseplate facing away from the semiconductor element is provided with laser machined grooves suitable for conducting heat transfer fluid,
    wherein the grooves comprise a transition region between first ones of the grooves and second ones of grooves, the transition region being shaped so that flow-resistance from the first ones of the grooves to the second ones of the grooves is smaller than flow-resistance in an opposite direction from the second ones of the grooves to the first ones of the grooves.

2. A semiconductor module according to claim 1, wherein grooves have a rounded bottom profile.

3. A semiconductor module according to claim 1, wherein widths of the grooves are on a range from 25 µm to 2000 µm and depths of the grooves are on a range from 25 µm to 2000 µm.

4. A semiconductor module according to claim 1, wherein the grooves are branching so that a sum of gross-sectional areas of the grooves increases in each branching.

5. A semiconductor module according to claim 4, wherein an area provided with the grooves on the outer surface of the baseplate has substantially a rectangular shape and the grooves are substantially parallel with longer sides of the rectangular area.

6. A semiconductor module according to claim 4, wherein the semiconductor module comprises a thermally conductive and electrically insulating structure having mechanical contacts with the semiconductor element and with an inner surface of the baseplate facing towards the semiconductor element.

7. A semiconductor module according to claim 4, wherein the baseplate and the cover element constitute airtight encapsulation for the at least one semiconductor element.

8. A semiconductor module according to claim 4, wherein the semiconductor element comprises one of the following: a bipolar junction transistor "BJT", a diode, an insulated gate bipolar transistor "IGBT", a thyristor, a gate-turn-off thyristor "GTO", a metal-oxide-semiconductor field-effect transistor "MOSFET".

9. A semiconductor module according to claim 1, wherein an area provided with the grooves on the outer surface of the baseplate has substantially a rectangular shape and the grooves are substantially parallel with longer sides of the rectangular area.

10. A semiconductor module according to claim 1, wherein the semiconductor module comprises a thermally conductive and electrically insulating structure having mechanical contacts with the semiconductor element and with an inner surface of the baseplate facing towards the semiconductor element.

11. A semiconductor module according to claim 1, wherein the baseplate and the cover element constitute airtight encapsulation for the at least one semiconductor element.

12. A semiconductor module according to claim 1, wherein the semiconductor element comprises one of the following: a bipolar junction transistor "BJT", a diode, an insulated gate bipolar transistor "IGBT", a thyristor, a gate-turn-off thyristor "GTO", a metal-oxide-semiconductor field-effect transistor "MOSFET".

13. A method for fabricating a semiconductor module, the method comprising:
   obtaining a semiconductor module that comprises a baseplate, a cover element attached to the baseplate so that detaching the cover element from the baseplate requires material deformations, and a semiconductor element in a room defined by the baseplate and the cover element, the semiconductor element being in a heat conductive relation with the baseplate, and
   subsequently laser machining, on an outer surface of the baseplate facing away from the semiconductor element, grooves suitable for conducting heat transfer fluid.

* * * * *